United States Patent
Matsuda et al.

(10) Patent No.: US 7,874,648 B2
(45) Date of Patent: Jan. 25, 2011

(54) MANUFACTURING METHOD FOR PIEZOELECTRIC BODY, PIEZOELECTRIC ELEMENT, AND LIQUID DISCHARGE HEAD

(75) Inventors: Takanori Matsuda, Chofu (JP); Kenichi Takeda, Yokohama (JP); Katsumi Aoki, Yokohama (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 822 days.

(21) Appl. No.: 11/773,009

(22) Filed: Jul. 3, 2007

(65) Prior Publication Data
US 2008/0012909 A1    Jan. 17, 2008

(30) Foreign Application Priority Data
Jul. 14, 2006    (JP)    ............................. 2006-194703

(51) Int. Cl.
B41J 2/045    (2006.01)
H04R 17/00    (2006.01)
(52) U.S. Cl. ........................................ 347/68; 29/25.35
(58) Field of Classification Search .................... 347/68, 347/70–72; 29/25.35; 310/311, 358
See application file for complete search history.

(56) References Cited

U.S. PATENT DOCUMENTS 7,120,978 B2    10/2006    Wasa et al.
7,144,101 B2    12/2006    Ifuku et al.
7,591,543 B2*    9/2009    Aoki et al. .................... 347/68
2008/0012908 A1    1/2008    Takeda et al.
2008/0012910 A1    1/2008    Matsuda et al.

FOREIGN PATENT DOCUMENTS

JP    6-171939    6/1994

* cited by examiner

Primary Examiner—An H Do
(74) Attorney, Agent, or Firm—Fitzpatrick, Cella, Harper & Scinto (57) ABSTRACT

A method of manufacturing a piezoelectric body, formed from a film made of an $ABO_3$ perovskite oxide crystal epitaxially grown on a substrate, includes forming a film containing an $AO_x$ crystal by using an oxide containing an A element and a B element by heating the substrate to a temperature which is equal to or higher than a temperature at which the $AO_x$ crystal is formed, and which is lower than a temperature at which the $ABO_3$ perovskite oxide crystal is formed and changing the film containing the $AO_x$ crystal into a film made of the $ABO_3$ perovskite oxide crystal by heating the substrate to a temperature which exceeds a temperature at which the $AO_x$ crystal can be present, and which is equal to or higher than a temperature at which the $ABO_3$ perovskite oxide crystal is formed.

7 Claims, 6 Drawing Sheets

MANUFACTURING METHOD FOR PIEZOELECTRIC BODY, PIEZOELECTRIC ELEMENT, AND LIQUID DISCHARGE HEAD

BACKGROUND OF THE INVENTION

1. Field of the Invention

The present invention relates to a manufacturing method for a piezoelectric body having an $ABO_3$ perovskite oxide crystal film, a piezoelectric element using a piezoelectric body obtained by the manufacturing method, and a liquid discharge head.

2. Description of the Related Art

A piezoelectric body has a piezoelectric property for reversible transformation between electrical energy and mechanical energy. Specifically, the electrical energy is transformed into mechanical displacement, stress, or vibration, and then transformation reverse to this is performed. There is known a piezoelectric element obtained by utilizing the piezoelectric property. According to the piezoelectric property, if the piezoelectric body is formed into a thin film and an electric field is applied between a pair of electrodes sandwiching the piezoelectric body, the piezoelectric body causes displacement, and is restored if the electric field is removed therefrom. Depending on bending displacement to be generated, the piezoelectric element is classified into a uni-morph type, a bi-morph type, and the like. Specifically, those piezoelectric elements are used for various oscillators or radiators such as a motor which requires a reciprocating operation, an ultrasonic motor, a transducer, an actuator, an ink jet head, a microphone, and a sounding body (such as a speaker), various sensors in the field of biotechnology, medicine, and the like, an acceleration sensor for an automobile, a pressure sensor for measurement, and the like. Particularly, because of an excellent printing performance, simple handling, low costs, and the like, the piezoelectric element having the piezoelectric body utilizing a pressure wave is used in many cases for ink discharge of an ink jet head applied to a printing apparatus for a personal computer or the like. In the ink jet head using the piezoelectric element, for example, multiple individual liquid chambers each containing ink and communicating with a common liquid chamber are provided, displacement of the piezoelectric elements that are provided so as to correspond to the individual liquid chambers is transferred through a diaphragm, and the ink provided inside thereof is ejected as liquid droplets.

In recent years, while a color ink jet printer has been widely used, in addition to a demand for improvement of the printing performance, in particular, higher resolution and high-speed printing, there is another demand for increase in length and reduction in costs. Accordingly, with a structure of a multi-nozzle head having individual liquid chambers miniaturized, achievement of the higher resolution and high-speed printing has been attempted. In order to miniaturize the individual liquid chambers of the liquid jet head, it is necessary to achieve miniaturization, higher density, and higher performance of the piezoelectric element. In order to achieve increase in length and reduction in costs of the liquid jet head, it is necessary to enlarge an area of a substrate used for manufacturing the liquid jet head.

Up to now, the piezoelectric body used for the piezoelectric element is manufactured as, for example, a PZT-based ceramic oxide film by sintering a green sheet obtained by forming powdered paste of PbO, $ZrO_2$, and $TiO_2$ into a sheet shape. However, it is difficult to form the PZT-based ceramic oxide film with a thickness of, for example, 10000 nm or less by employment of that method. The green sheet is sintered at a temperature of 1000° C. or more, so the green sheet is shrunk to about 70% of its original length. It is impossible to apply the method of producing the piezoelectric body using the green sheet to production of the piezoelectric element for ink discharge of the ink jet head which is required to be positioned with a dimensional accuracy of an order of several micrometers.

Further, as a method of producing the piezoelectric body used in manufacturing the piezoelectric element, there is reported a method of producing a ceramic thin film having a thickness of 10000 nm or less by employment of a sputtering method, a CVD method, an MBE method, a sol-gel method, or the like. Those methods of producing the ceramic thin film are classified roughly into two types. One of them is a method of obtaining a desired crystalline thin film by epitaxial growth with the heating deposition (heating deposition method). Another one is a method, which is disclosed in Japanese Patent Application Laid-Open No. 06-171939, of obtaining a crystalline thin film by application of energy from an outside by thermal sintering, application of light, or the like after an amorphous film serving as a precursor of a crystal film is formed (post-annealing method).

In a case where the piezoelectric body is produced by the above-mentioned heating deposition method, a state where constituent atoms in interfaces between, for example, a substrate and a lower layer such as a lower electrode are scattered, or local projection of atoms of the lower layer occurs. For example, by observation using a transmission electron microscope (TEM), local projection of platinum used for the lower electrode, or interdiffusion of the constituent atoms have been found. It has been recognized that the local projection of the lower electrode is caused due to high-temperature heating at the time of production of the piezoelectric body. With regard to the interdiffusion of the constituent atoms, there is a fear that, in the vicinity of the interface with the lower layer, deviation from an original stoichiometric composition is generated, and another compound is formed of elements dissipated from the piezoelectric body. Therefore, a piezoelectric element having a foreign matter layer incorporated therein is produced separately from a piezoelectric element having a layer structure originally intended, which leads to significant deterioration of the piezoelectric property.

On the other hand, in a case where the piezoelectric body is produced by the post-annealing method, crystalline nuclei are randomly generated everywhere in a film during a process of transition from an amorphous film to a crystal film. Therefore, it is extremely difficult to control a crystal orientation property. Further, there arises a problem in that the piezoelectric body has high density, and an in-plane stress of the film becomes extremely large, which disturbs the piezoelectric property itself and deteriorates the adhesion between the film and the lower layer. It is impossible to use the piezoelectric element including the piezoelectric body as a piezoelectric element of the ink jet head which requires high adhesion between the piezoelectric layer and the lower layer with respect to the stress of reciprocating drive, and excellent durability.

SUMMARY OF THE INVENTION

In order to solve the above-mentioned problems, it is an object of the present invention to provide a manufacturing method for a piezoelectric body having a controlled crystal orientation, an excellent piezoelectric property, and having an adequate number of pores. It is another object of the present invention to obtain a piezoelectric body having an excellent piezoelectric property, high adhesion between an upper layer and a lower layer, and excellent durability, while film peeling thereof being suppressed, to thereby provide a piezoelectric element using the piezoelectric body. It is further another object of the present invention to provide a liquid discharge head suitable for an ink jet head, which is capable of achieving higher resolution and high-speed printing, has a large liquid discharge amount even when an individual liquid chamber is miniaturized and provided with high density, and has an enlarged area.

In order to solve the above-mentioned problems, the inventors have devoted themselves to study a perovskite oxide material. It has been acknowledged that when a substrate is heated up to a temperature which is equal to or higher than a temperature for forming an $AO_x$ crystal and which is lower than a temperature for forming an $ABO_3$ perovskite oxide crystal to thereby form an epitaxial film, an $AO_x$ crystallized film is first obtained on the substrate. It has been found that, the substrate is thereafter heated up to a temperature for forming the $ABO_3$ perovskite oxide crystal which exceeds a temperature at which the $AO_x$ crystal can be present, thereby obtaining an $ABO_3$ perovskite oxide crystal film having a controlled crystal orientation, extremely high crystallinity, and pores. It has been acknowledged that the piezoelectric element using the $ABO_3$ perovskite oxide crystal film having high crystallinity as the piezoelectric body, has high adhesion between an upper layer and a lower layer thereof and has excellent durability. It has found that, particularly in a case where deposition of the perovskite oxide is performed in a vacuum by the use of an epitaxial deposition technique, a perovskite oxide crystal film which is highly oriented and has high crystallinity can be obtained in spite of achieving high porosity. It has been acknowledged that, particularly in the piezoelectric element using the perovskite oxide crystal film, film peeling thereof is suppressed and excellent durability is obtained. Based on the acknowledgement, the present invention has been achieved.

In other words, the present invention relates to a method of manufacturing a piezoelectric body, formed from a film made of an $ABO_3$ perovskite oxide crystal epitaxially grown on a substrate, including: forming a film containing an $AO_x$ crystal by using an oxide containing an A element and a B element by heating the substrate to a temperature which is equal to or higher than a temperature at which the $AO_x$ crystal is formed and which is lower than a temperature at which the $ABO_3$ perovskite oxide crystal is formed; and changing the film containing the $AO_x$ crystal into a film made of the $ABO_3$ perovskite oxide crystal by heating the substrate to a temperature which exceeds a temperature at which the $AO_x$ crystal can be present, and which is equal to or higher than a temperature at which the $ABO_3$ perovskite oxide crystal is formed.

Further, the present invention relates to a piezoelectric element including: a piezoelectric body including a film made of an $ABO_3$ perovskite oxide crystal obtained by using the above-mentioned method of manufacturing a piezoelectric body; and a pair of electrodes provided to the piezoelectric body.

Further, the present invention relates to a liquid discharge head including: the above-mentioned piezoelectric element; a discharge port for discharging a liquid; and a liquid chamber which is provided so as to correspond to the piezoelectric element and which communicates with the discharge port.

According to the method of manufacturing a piezoelectric body according to the present invention, it is possible to manufacture a piezoelectric body having a controlled crystal orientation, excellent crystallinity, an excellent piezoelectric property, and an adequate number of pores.

Further, the piezoelectric element according to the present invention has an excellent piezoelectric property, high adhesion between an upper layer and a lower layer, and excellent durability while suppressing film peeling.

The liquid discharge head according to the present invention is suitable for an ink jet head capable of achieving higher resolution and high-speed printing, having a large liquid discharge amount even when the individual liquid chamber is miniaturized and provided with high density, and having an enlarged area.

Further features of the present invention will become apparent from the following description of exemplary embodiments with reference to the attached drawings.

DESCRIPTION OF THE EMBODIMENTS

Manufacturing Method for Piezoelectric Body

A manufacturing method for a piezoelectric body according to the present invention is characterized by including the following processes.

A substrate is heated up to a temperature which is equal to or higher than a temperature at which an $AO_x$ crystal is formed and which is lower than a temperature at which an $ABO_3$ perovskite oxide crystal is formed, to thereby form a film including the $AO_x$ crystal using an oxide containing an A element and a B element.

The substrate is heated up to a temperature which exceeds a temperature at which the $AO_x$ crystal can be present, and which is equal to or higher than a temperature at which the $ABO_3$ perovskite oxide crystal is formed, thereby changing the film including the $AO_x$ crystal into a film made of the $ABO_3$ perovskite oxide crystal.

An example of an epitaxial deposition method used for deposition of the $ABO_3$ perovskite oxide crystal film according to the manufacturing method for a piezoelectric body of the present invention includes a method to which a technique of forming a deposited film that is used in a semiconductor manufacturing process is applied. Specifically, there are deposition methods performed in vacuum such as a sputtering method, a vacuum evaporation method, a CVD method, and a laser ablation method, and other methods including a sol-gel method and an electrodeposition method. Of those methods, the deposition methods performed in vacuum are desirable examples. Particularly, the sputtering method is desirably employed because the substrate can be heated sufficiently and a crystal film having high crystal orientation can be obtained. The sputtering method is a method in which an inert gas such as Ar is introduced in a vacuum, a high voltage is applied between a substrate and a target material to generate inert gas ions, and the inert gas ions are caused to collide with the target material, thereby depositing the sputtered target material on the substrate.

As a substrate used for forming the $ABO_3$ perovskite oxide crystal film by the epitaxial deposition method, one made of a crystalline material is desirably used. For example, Si, SOI having an $SiO_2$ film formed on Si, and $SrTiO_3$ having a coefficient of linear thermal expansion larger than that of the $ABO_3$ perovskite oxide can be used. It is also possible to use a substrate serving as a lower electrode by being doped with La, Zn, S, or the like, whereby the lower electrode can be omitted (LaSTO). Alternatively, it is possible to use a substrate having a buffer layer, formed thereon, for adjusting a crystal orientation with the $ABO_3$ perovskite oxide crystal film. The substrate has a thickness of, for example, 100 μm to 1000 μm.

As an example of an oxide which contains an A element and a B element and is used for the manufacturing method for a piezoelectric body according to the present invention, an $ABO_3$ perovskite oxide is a representative example in which the A element desirably contains Pb as a main component and the B element desirably contains Zr and Ti. As the $ABO_3$ perovskite oxide, an oxide represented by the following formula (1) is a desirable example.

$$(Pb1-xMx)xm(ZryTi1-y)O_z \quad (1)$$

In the formula (1), M represents an atom of any one of La, Ca, Ba, Sr, Bi, Sb, W, and Nb. Further, in the formula (1), x, xm, and y desirably represent numerical values determined such that the compositions of the $ABO_3$ perovskite oxide crystal film satisfy $0 \leq x < 0.2$, $1.0 \leq xm \leq 1.3$, $0.40 \leq y < 0.65$, and $2.5 \leq z \leq 3.0$, respectively. By the use the $ABO_3$ perovskite oxide, it is possible to obtain the $ABO_3$ perovskite oxide crystal film having an excellent crystal orientation and an excellent piezoelectric property.

A form of the $ABO_3$ perovskite oxide can be appropriately selected depending on the deposition method for the $ABO_3$ perovskite oxide crystal film. For example, in a case of employing the epitaxial deposition method performed in vacuum, such as a sputtering method, it is possible to use, as a target material, a material obtained by appropriately mixing a plurality of oxides made of constituent metal atoms so as to obtain a composition of the above-mentioned $ABO_3$ perovskite oxide. In a case of employing the sol-gel method and the like, it is possible to use, as a coating liquid, a material obtained by appropriately mixing a plurality of oxides made of constituent metal atoms in a solvent so as to obtain the composition of the above-mentioned $ABO_3$ perovskite oxide.

By the use of the $ABO_3$ perovskite oxide, the substrate is heated up to the temperature which is equal to or higher than the temperature for forming an $AO_x$ crystal and which is lower than the temperature for forming the $ABO_3$ perovskite oxide crystal to thereby form an $AO_x$ crystal film on the substrate. For example, in a case where $PbZryTi1-yO_3$ is used, a temperature which is equal to or higher than a temperature for forming a $PbO_2$ crystal and which is lower than a temperature for forming a $PbZryTi1-yO_3$ crystal is, for example, equal to or higher than 350° C. and lower than 450° C. Also when $PbMgNbO_3$—$PbTiO_3$ is used, the substrate is heated under the same conditions as described above, whereby the deposited film can be formed.

Figure 1:
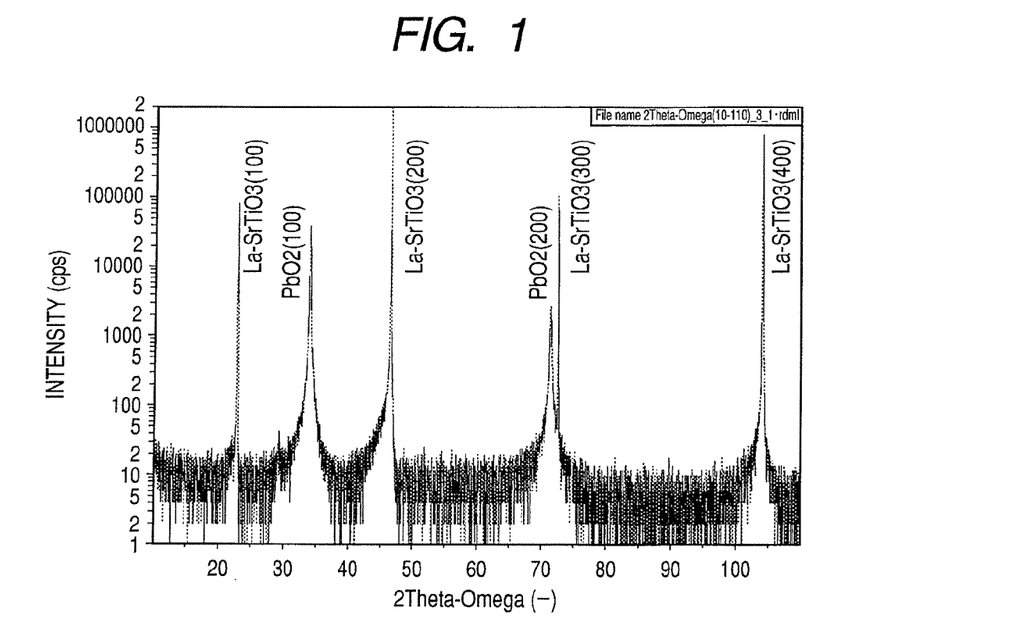
FIG. 1 is a diagram illustrating a θ-2θ profile by X-ray diffraction of a film formed on a substrate during a process of a manufacturing method for a piezoelectric body according to the present invention.

An $AO_x$ crystal phase, which is formed on the substrate by heating the substrate up to the temperature which is equal to or higher than the temperature for forming the $AO_x$ crystal and which is lower than the temperature for forming the $ABO_3$ perovskite oxide crystal, can be recognized by X-ray diffraction. For example, when $PbZryTi1-yO_3$ is used as the $ABO_3$ perovskite oxide and films are formed on an $SrTiO_3$ substrate which is heated up to the temperature which is equal to or higher than the temperature for forming the $PbO_2$ crystal and which is lower than the temperature for forming the $PbZryTi1-yO_3$ crystal, a $PbO_2$ crystal phase is formed. Specifically, as illustrated in FIG. 1, in the 2θ-θ profile by X-ray diffraction of the crystal film obtained through deposition by employment of the sputtering method with $PbZryTi1-yO_3$ used as a target, only a peak of $PbO_2$ appears, which indicates that only the $PbO_2$ phase is formed. While being affected by the orientation of the lower layer, the orientation of the $AO_x$ crystal film is desirably (100), (111), or (110).

Figure 2:
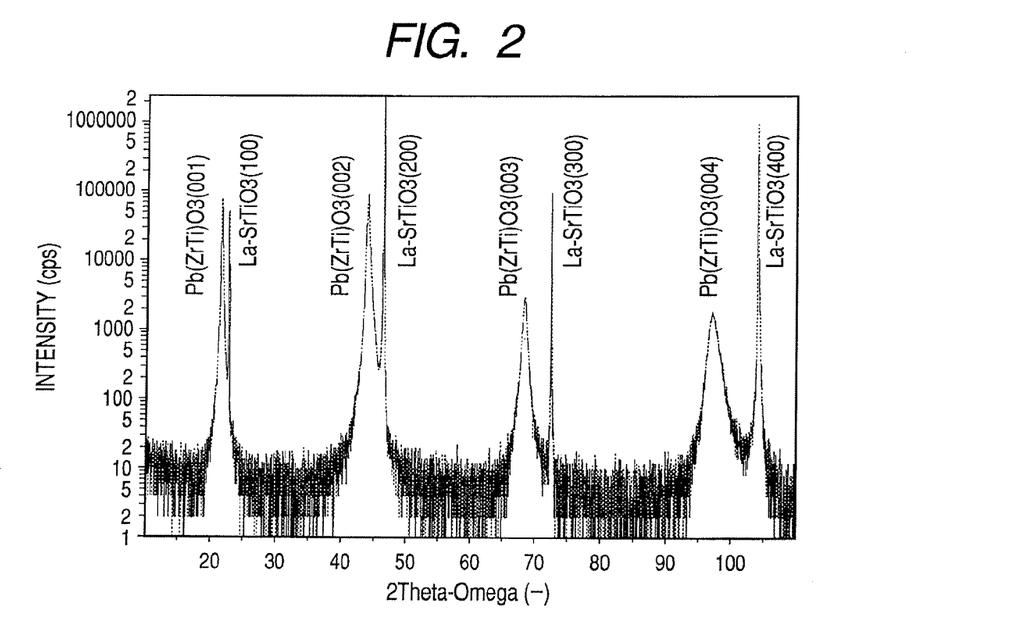
FIG. 2 is a diagram illustrating a θ-2θ profile by X-ray diffraction of an $ABO_3$ perovskite oxide crystal film obtained by the manufacturing method for a piezoelectric body according to the present invention.

After that, the substrate is heated up to the temperature for forming the $ABO_3$ perovskite oxide crystal which exceeds the temperature at which the $AO_x$ crystal film can be present, to thereby change the $AO_x$ crystal film into the $ABO_3$ perovskite oxide crystal film. For example, when the $PbO_2$ phase, which is formed by using $PbZryTi1-yO_3$ as the $ABO_3$ perovskite oxide and heating the $SrTiO_3$ substrate to a temperature lower than 450° C., is heated to the temperature for forming the $PbZryTi1-yO_3$ crystal, that is, 600° C. or higher, the $PbO_2$ phase becomes a $PbZryTi1-yO_3$ crystal phase. As illustrated in FIG. 2, in the 2θ-θ profile by X-ray diffraction of the crystal film formed on the substrate, the peak of the $PbO_2$ (100) of the $AO_x$ crystal phase disappears, and only a peak of $PbZryTi1-yO_3$ appears, whereby the $PbO_2$ phase is changed into the $PbZryTi1-yO_3$ crystal phase. In this case, the temperature for forming the $ABO_3$ perovskite oxide crystal which exceeds the temperature at which the $AO_x$ crystal film can be present, is desirably 700° C. or lower.

Figure 11:
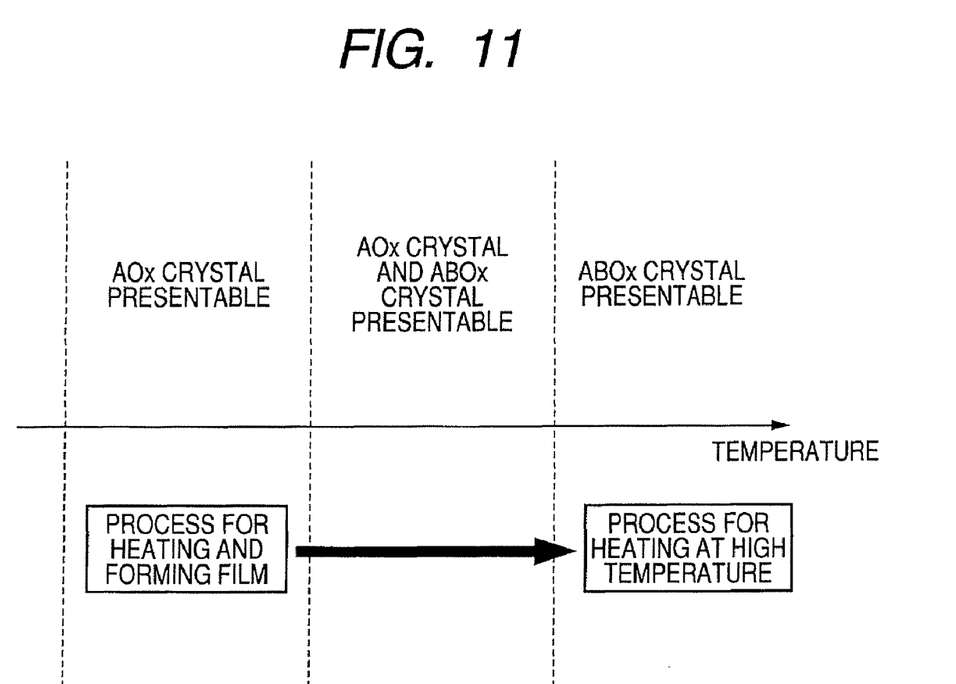
FIG. 11 is a schematic diagram illustrating the manufacturing method for a piezoelectric body according to the present invention.

FIG. 11 is a schematic diagram illustrating the manufacturing method for a piezoelectric body according to the present invention. In FIG. 11, a "process for heating and forming a film" is a process for heating the substrate up to the temperature which is equal to or higher than the temperature for forming the $AO_x$ crystal and which is lower than the temperature for forming the $ABO_3$ perovskite oxide crystal, to thereby form a film including the $AO_x$ crystal by the use of an oxide containing the A element and the B element. Further, in FIG. 11, a "process for heating at a high temperature" is a process for heating the substrate up to the temperature which exceeds the temperature at which the $AO_x$ crystal can be present, and which is equal to or higher than the temperature at which the $ABO_3$ perovskite oxide crystal is formed. In this case, the film containing the $AO_x$ crystal is changed into the film made of the $ABO_3$ perovskite oxide crystal.

By the manufacturing method for a piezoelectric body according to the present invention, it is possible to form the $ABO_3$ perovskite oxide crystal film to thereby obtain the piezoelectric body. With regard to the crystallinity of the $ABO_3$ perovskite oxide crystal film, the degree of crystallinity may be 100% or 90%. In this case, the degree of crystallinity can be measured by XRD measurement. The degree of crystallinity of 100% means that the crystal having an orientation different from the main orientation cannot be measured, and the degree of crystallinity of 90% means that the presence of the orientation different from the main orientation is less than (100-90)%.

Figure 3:
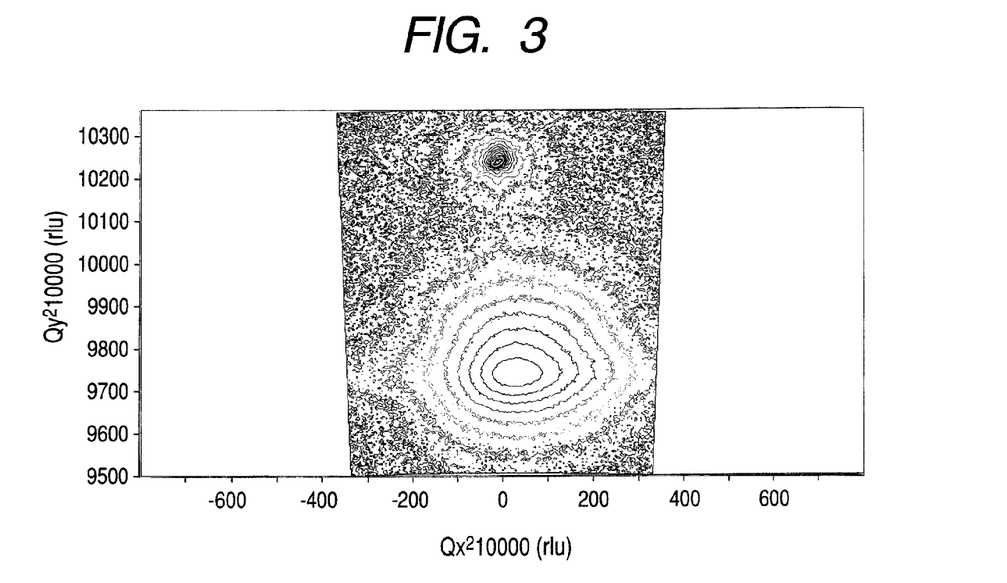
FIG. 3 is a diagram illustrating a reciprocal space map of the $ABO_3$ perovskite oxide crystal film obtained by the manufacturing method for a piezoelectric body according to the present invention.

The $ABO_3$ perovskite oxide crystal film thus obtained has excellent crystallinity not only in a crystal growth direction but also in a film surface direction. Specifically, by reciprocal space mapping of the $PbZr_yTi1-yO_3$ (004) illustrated in FIG. 3, it can be recognized that the $PbZrYTi1-yO_3$ crystal film has excellent crystallinity also in the film surface direction.

Figure 4:
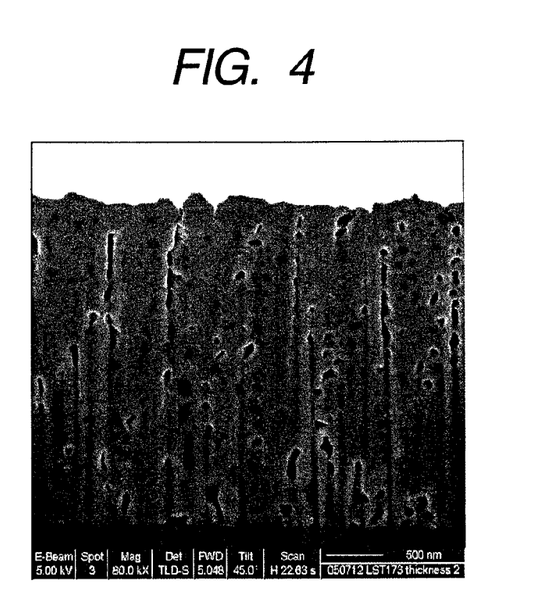
FIG. 4 is a diagram illustrating a cross-section SEM image of the $ABO_3$ perovskite oxide crystal film obtained by the manufacturing method for a piezoelectric body according to the present invention.

In addition, the $ABO_3$ perovskite oxide crystal film formed by the above-mentioned method has an adequate number of pores, and the pores are formed in a continuous manner in the film thickness direction. It is apparent also from a scanning electron microscope (SEM) image illustrated in FIG. 4 that the $PbZr_yTi1-yO3$ crystal film has the pores formed in a continuous manner in the film thickness direction.

Further, the $ABO_3$ perovskite oxide crystal film manufactured by the above-mentioned method desirably has a thickness of 100 nm to 10 μm. If the film thickness thereof is 100 nm or more, it is possible to obtain a sufficient displacement amount when the $ABO_3$ perovskite oxide crystal film is used as a piezoelectric body of a liquid discharge head of an ink jet recording apparatus. If the film thickness thereof is 10 μm or smaller, the $ABO_3$ perovskite oxide crystal film is desirably used as the piezoelectric body of the liquid discharge head with higher finesse.

As the piezoelectric body manufactured by the manufacturing method for a piezoelectric body according to the present invention, one formed of the $ABO_3$ perovskite oxide crystal film or one obtained by stacking another function layer on the $ABO_3$ perovskite oxide crystal film may be used.

In addition, with regard to a shape of the piezoelectric body, an upper surface thereof may not have a rectangular shape, but may have an oval shape, a circular shape, a parallelogram shape, or the like, and a cross-section thereof may have a rectangular shape, a trapezoidal shape, or an inverted trapezoidal shape.

(Piezoelectric Element)

The piezoelectric element according to the present invention includes a piezoelectric layer formed of a piezoelectric body having an $ABO_3$ perovskite oxide crystal film obtained by employment of the above-mentioned manufacturing method for a piezoelectric body, and electrode layers provided to an upper portion and a lower portion of the piezoelectric layer.

Figure 5:
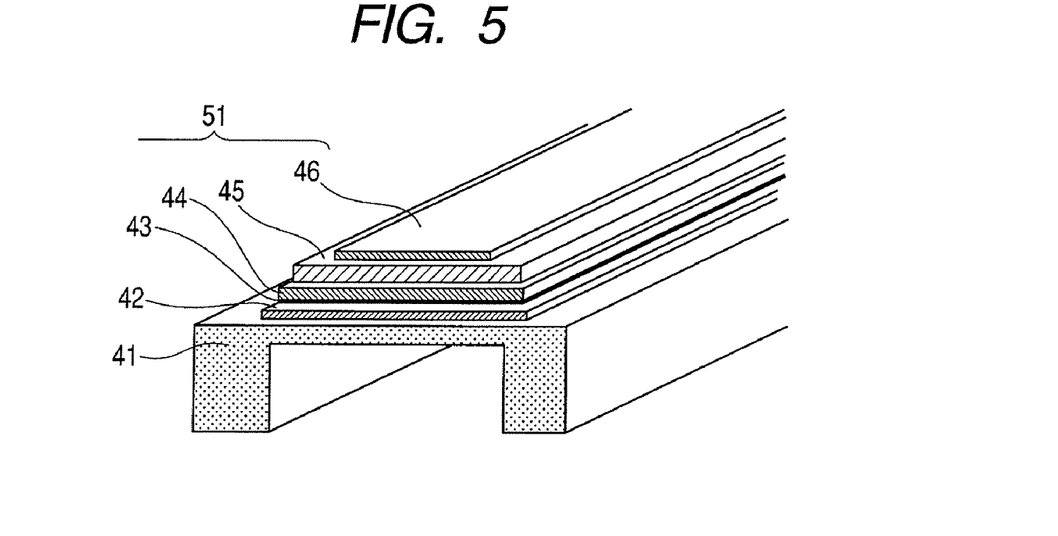
FIG. 5 is a schematic view illustrating a structure of an example of a piezoelectric element according to the present invention.

As an example of the piezoelectric element according to the present invention includes, FIG. 5 illustrates a piezoelectric element 51 having a stacked structure in which a substrate 41, a diaphragm 42, a buffer layer 43, a lower electrode layer 44, a piezoelectric layer 45 formed of a piezoelectric body having the above-mentioned $ABO_3$ perovskite oxide crystal film, and an upper electrode layer 46 are subsequently stacked.

The substrate desirably has excellent crystallinity. For example, Si is desirably used, and a specific example thereof includes SOI having an $SiO_2$ film formed on Si. In addition, $SrTiO_3$ having a coefficient of linear thermal expansion larger than that of the piezoelectric material is a desirable example. The thickness of the substrate is, for example, 100 μm to 1000 μm.

The diaphragm desirably has sufficiently high Young's modulus so as to be provided to transfer displacement of the piezoelectric body, have an excellent matching property of a crystal orientation and a crystal lattice constant with respect to the substrate, and to enable amplification of the displacement of the piezoelectric body to be transferred. An example of a material of the diaphragm includes stabilized zirconia and $SrTiO_3$. When the SOI is used as the substrate, the $SiO_2$ layer formed on an Si single crystal layer can also be used as a diaphragm. Alternatively, a part of the substrate and the buffer layer may be used as a diaphragm. The thickness of the diaphragm is, for example, 2 μm to 10 μm.

The buffer layer is provided so as to adjust the crystal lattice constant of the substrate and the crystal lattice constant of the piezoelectric body to ensure the lattice matching property. In a case where the lattice matching property between the substrate and the piezoelectric body is excellent, the buffer layer may be omitted. When it is necessary to apply a compression stress to the piezoelectric body, it is desirable to select a material has durability for the compression stress. The function of the buffer layer may be achieved by a stacked structure with multiple layers. As the material of the buffer layer, a material having an excellent crystal lattice matching property also with respect to a diaphragm immediately below the buffer layer is desirably used. In a case where the material of the substrate is Si, for example, stabilized zirconia YSZ ($Y_2O_3$—$ZrO_2$), $CeO_2$, and $SrTiO_3$ may be used. Further, when the lattice matching property between the substrate and the piezoelectric body is excellent, for example, when the material of the substrate is made of $SiTiO_3$, there is no necessity of providing the buffer layer.

The lower electrode layer may be provided immediately above the buffer layer 43 or may be provided between the diaphragm 42 and the buffer layer 43. When the buffer layer is not provided, the lower electrode layer can be provided through an adhesion layer for improving the adhesion between the lower electrode layer and the diaphragm. Specifically, as a material of the lower electrode layer, a platinum group metal including Ru, Rh, Pd, Os, Ir, and Pt, and an oxide-based conductive material such as $SrRuO_3$, $LaScCoO_3$, $BaPbO_3$, and $RuO_3$ may be used. As a material of the adhesion layer, for example, a metal such as Ti, Ci, and Ir, or an oxide made of those metals, such as $TiO_2$ and $IrO_2$ may be used.

The lower electrode layer desirably has a preferred crystal orientation of (100), (110), or (111) on the surface in contact with the substrate because the lower electrode layer affects the crystal orientation of the piezoelectric body formed thereon. If the preferred crystal orientation of the lower electrode layer on the surface in contact with the substrate is (100), (110), or (111), the piezoelectric body to be stacked is oriented with the preferred crystal orientation of (100)/(001).

A metal thin film or a thin film made of the oxide conductive material, which constitutes the lower electrode layer, desirably has a crystal orientation rate of 80% or more. The crystal orientation rate is assumed as a rate which is obtained as a peak strength ratio of a film by θ-2θ measurement with X-ray diffraction. If the metal thin film or the thin film made of the oxide conductive material has the crystal orientation rate of 80% or more, the lower electrode layer has an excellent electrical characteristic, and the piezoelectric body formed thereon has excellent crystallinity. The metal thin film or the thin film made of the oxide conductive material, which constitutes the lower electrode layer, has desirably the crystal orientation rate of 90% or more. In addition, the thickness of the lower electrode layer is desirably 100 nm to 1000 nm, and the thickness thereof in a case where the adhesion layer is provided is desirably 5 nm to 300 nm, and more desirably 10 nm to 70 nm.

The piezoelectric layer includes, as an oxide containing the A element and the B element, the $ABO_3$ perovskite oxide film formed by the epitaxial deposition method by the use of the $ABO_3$ perovskite oxide. In the $ABO_3$ perovskite oxide, it is desirable that the A element mainly contains Pb and the B element contains Zr and Ti. As the $ABO_3$ perovskite oxide, an oxide represented by the following formula (1) is a desirable example.

$$(Pb_{1-x}M_x)_{xm}(Zr_yTi_{1-y})O_z \quad (1)$$

In the formula (1), M represents an atom of any one of La, Ca, Ba, Sr, Bi, Sb, W, and Nb. Further, in the formula (1), x, xm, and y desirably represent numerical values determined such that the compositions of the $ABO_3$ perovskite oxide crystal film satisfy $0 \leq x < 0.2$, $1.0 \leq xm \leq 1.3$, $0.40 \leq y < 0.65$, and $2.5 \leq z \leq 3.0$, respectively.

As an example of the upper electrode layer, one equivalent to the lower electrode layer may be used.

The piezoelectric element includes the above-mentioned piezoelectric body, the piezoelectric layer having an adequate number of pores, and has a uniform crystal structure also in the layer direction. Accordingly, the piezoelectric element has a large displacement amount, an excellent piezoelectric property, a matching property in the crystal orientation between layers, and excellent durability.

As the piezoelectric element according to the present invention, the following structures made of materials shown in items (1) to (4) can be exemplified. In the following, "/" indicates a stacked state.

(1) Pt/Ti (upper electrode layer):$PbZrTiO_3$ (piezoelectric layer):Pt (lower electrode layer) $LaNiO_3/CeO_2/YSZ$ ($Y_2O_3$—$ZrO_2$) (buffer layer):Si/SiOx (diaphragm):Si (substrate).

(2) $SrRuO_3$ (upper electrode layer):$PbZrTiO_3$ (piezoelectric layer):$SrRuO_3$ (lower electrode layer):$LaNiO_3/CeO_2/$ YSZ ($Y_2O_3$—$ZrO_2$) (buffer layer) $Si/SiO_2$ (diaphragm):Si (substrate).

(3) Pt/Ti (upper electrode layer):$PbZrTiO_3$ (piezoelectric layer):$SrRuO_3$ (lower electrode layer):$LaNiO_3/CeO_2/YSZ$ ($Y_2O_3$—$ZrO_2$) (buffer layer) $Si/SiO_2$ (diaphragm):Si (substrate).

(4) Pt/Ti (upper electrode layer):$PbZrTiO_3$ (piezoelectric layer):$Pt/SrRuO_3$ (lower electrode layer):$LaNiO_3/CeO_2/YSZ$ ($Y_2O_3$—$ZrO_2$) (buffer layer) $Si/SiO_2$ (diaphragm):Si (substrate).

An example of a manufacturing method for the above-mentioned piezoelectric element includes a method of producing layers by the use of the epitaxial deposition technique to which the technique of forming a deposited film used for a semiconductor manufacturing process applies.

As a method of producing the diaphragm, for example, a thin film production method such as the sputtering method, the CVD method, the laser ablation method, and the MBE method may be used. Particularly in the sputtering method, it is possible to obtain an oxide thin film epitaxially grown with respect to the substrate by sufficiently heating a substrate during a heating process.

Further, as a method of producing the lower electrode layer, the thin-film deposition technique such as the sputtering method, the CVD method, a PLD method, the sol-gel method, the MBE method, and a hydrothermal synthesis method may be used. By those methods, deposition can be performed by orienting electrode materials in a specific direction. As a method of producing the buffer layer, the thin-film deposition technique such as the sputtering method, the CVD method, the PLD method, the sol-gel method, the MBE method, and the hydrothermal synthesis method may be used.

The piezoelectric layer can be produced by employment of the above-mentioned manufacturing method for a piezoelectric body.

As an example of a method of producing the upper electrode layer, a gas phase method such as the sputtering method and an evaporation method, an application method such as a screen printing method, and a liquid phase method such as a plating method may be used.

(Liquid Discharge Head)

The liquid discharge head according to the present invention is characterized by including the above-mentioned piezoelectric element, and an individual liquid chamber which generates volumetric change by transfer of displacement of the piezoelectric body of the piezoelectric element and has a discharge port for discharging a liquid provided inside thereof. The liquid discharge head according to the present invention includes the piezoelectric element, thereby having an excellent liquid discharge property and excellent performance in a liquid discharge device using the same.

Figure 6:
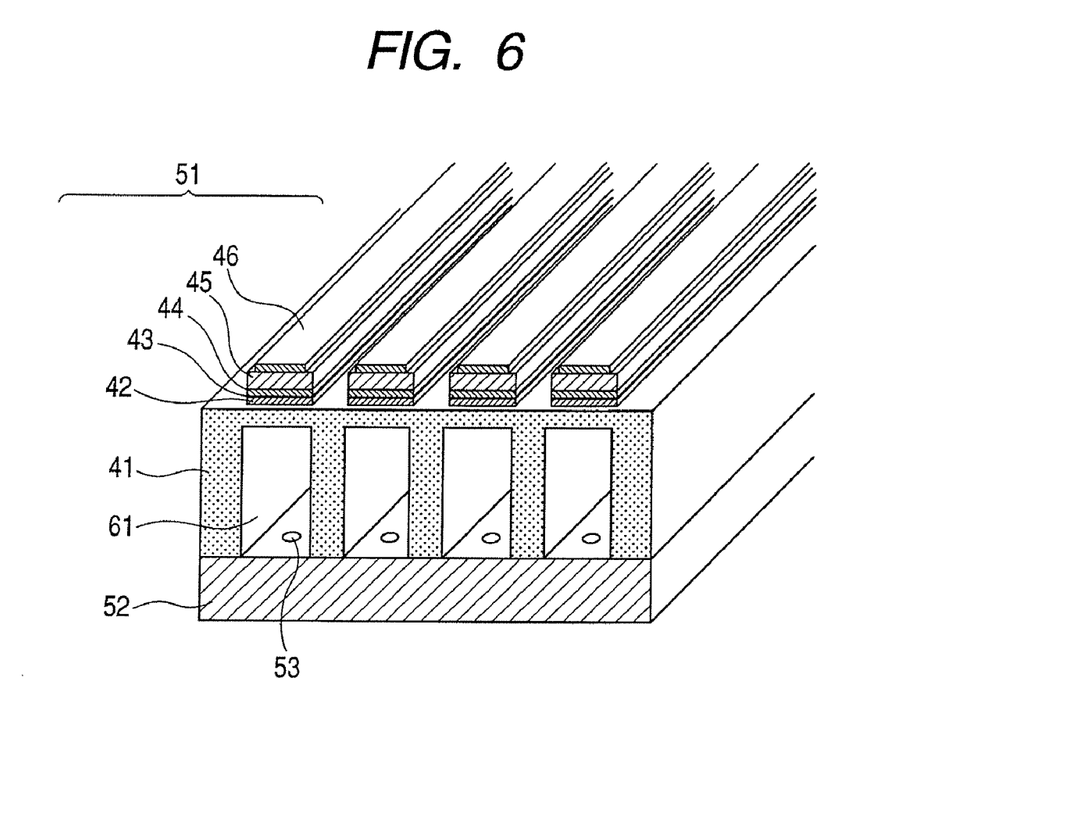
FIG. 6 is a schematic view illustrating a structure of an example of a liquid discharge head according to the present invention.

An example of an ink jet head, which is an example of the liquid discharge head according to the present invention, includes one illustrated in the schematic view of FIG. 6. In the ink jet head illustrated in FIG. 6, there are provided liquid chambers 61 each having a liquid discharge port 53 provided on a side of the substrate 41 which is opposite to a side thereof to which a piezoelectric element 51 is provided. While the liquid discharge ports provided on a lower surface of the liquid chambers are illustrated, the liquid discharge ports may also be provided on a side surface of the liquid chambers.

The liquid discharge head according to the present invention has large displacement while being miniaturized, and includes the piezoelectric element of the present invention having the piezoelectric body with pores, so the piezoelectric elements can be provided therein with high density, and the liquid discharge head has a large discharge force and a high discharge speed. In addition, the liquid discharge head has excellent durability with respect to repeated displacement while absorbing strain.

Figure 7:
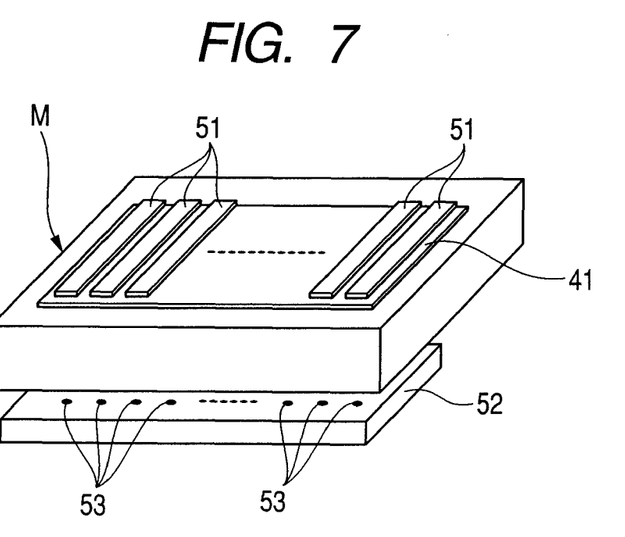
FIG. 7 is a schematic view illustrating a structure of another example of a liquid discharge head according to the present invention.

An example of a method of manufacturing the liquid discharge head according to the present invention includes a method of forming the liquid chambers 61 by forming, in the substrate 41 on which the piezoelectric element 51 is formed by the above-mentioned method, recessed portions on a side of the substrate 41 which is opposite to the side thereof to which the piezoelectric element 51 is provided. As illustrated in FIG. 7, there is another method of providing individual chambers and ink supply paths to a substrate M provided separately from the substrate 41 to which the piezoelectric element 51 is provided, and joining the substrate M to the substrate 41 to which the piezoelectric element is provided.

As the former method, on a back surface of the substrate 41 to which the piezoelectric element is provided, multiple recessed portions serving as the individual liquid chambers 61 are formed at predetermined pitches by wet etching using anisotropic etching, and dry etching such as ICP, a Riegger process, and a Bosch process. A shape of the cross-section of the individual liquid chamber in the stacking direction can be appropriately selected from, for example, a rectangular shape, a circular shape, and an oval shape. In a case of a side shooter, the individual liquid chamber may have a narrowed shape with a tapered portion toward the liquid discharge port.

A nozzle plate 52 having the liquid discharge ports 53 perforated therein is joined to the substrate 41 having the recessed portions formed therein. A material of the nozzle plate may be the same as or different from that of the substrate of the piezoelectric element, and is, for example, SUS and Ni. In this case, it is desirable to use a material with a coefficient difference of thermal expansion between the material and the substrate to be joined of 1E-6/° C. to 1E-8/° C.

As a method of joining the substrate 41 and the nozzle plate 52, a method of using an organic adhesive may be employed, but a method using metal bonding with an inorganic material is desirably employed. As a material to be used for the metal bonding, one capable of joining those substrates at a low temperature, that is, 250° C. or lower, and having a small coefficient difference of thermal expansion between the material and the substrate to be joined is desirably used from the viewpoint of preventing a problem of warp or the like of the element from occurring even when the element is increased in length, and suppressing a damage to the piezoelectric element. Specific examples of the material used for the metal bonding include In, Au, Cu, Ni, Pb, Ti, and Cr.

As the latter method, as illustrated in FIG. 7, the substrate 41 on which the piezoelectric element 51 is formed is joined to the substrate M after positioning the piezoelectric element so as to block opening portions (not shown) formed on a surface side of the substrate M in which the individual liquid chambers (not shown) are formed by a similar method as described above or the like. On the other hand, the nozzle plate 52 in which the liquid discharge ports 53 are formed is positioned to be joined so as to block opening portions (not shown) provided on a back surface side of the substrate M. As a method of bonding the substrates, a similar method as described above may be employed.

The above-mentioned liquid discharge head can be used for an ink jet recording apparatus such as a printer with high resolution and high-speed printing, a facsimile, a copying machine, and a multiple function machine, or a liquid discharge device for industrial use for discharging various types of liquids.

EXAMPLE

Example 1

The manufacturing method for a piezoelectric body, the piezoelectric element, and the liquid discharge head according to the present invention will be described in detail with examples.

First, by the use of a sputtering device, a film of stabilized zirconia YSZ ($Y_2O_3$—$ZrO_2$) was formed on an opening portion of an Si substrate to thereby produce a diaphragm. At this time, the Si substrate was heated up to 800° C., Ar and $O_2$ were used as ionized gases, sputtering was performed for 1 hour by setting applied power between the Si substrate and a target to 60 W and setting a pressure inside the device to 1.0 Pa to grow crystals, thereby obtaining a diaphragm having a single orientation and a film thickness of 200 nm.

Next, a lower electrode layer was produced in the same manner as in the method of producing the diaphragm. By the use of Pt as a target, sputtering was performed at a substrate temperature of 600° C., by the use of Ar as an ionized gas, with applied power between the diaphragm and the target of 100 W, and at a pressure inside the device of 0.5 Pa to grow crystals, thereby obtaining a Pt film having a single and high orientation and a thickness of 400 nm.

After that, by the use of the sputtering device and with a target having a composition described later, a piezoelectric body was produced by sputtering. Sputtering was performed at a substrate temperature of 400° C., by the use of Ar and O2 as ionized gases, with applied power between an electrode and the target of 100 W, and at a pressure inside the device of 0.5 Pa to grow crystals, thereby obtaining a piezoelectric body having a thickness of 3000 nm.

The composition of the target is represented by the following formula.

$$(Pb1-xMx)xm(ZryTi1-y)Oz \quad (1)$$

where M=La, x=0.6, xm=1.20, y=0.52, and z=3.0.

Figure 8:
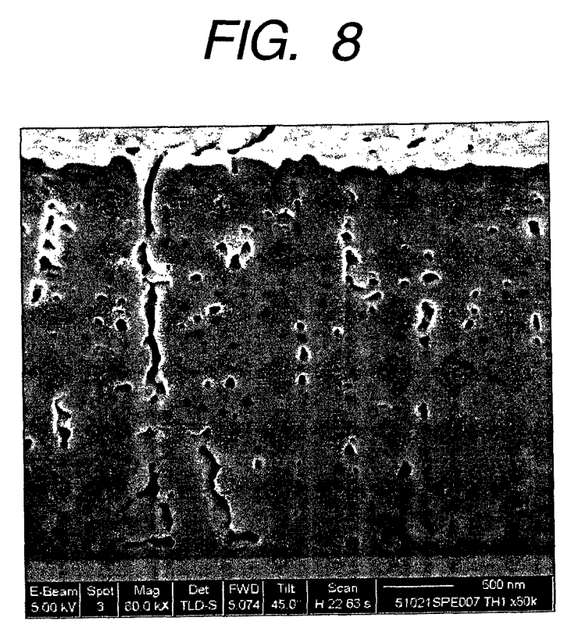
FIG. 8 is a diagram illustrating a cross-section SEM image of a piezoelectric element according to Example 1 of the present invention.

Then, rapid thermal annealing (RTA) was employed to perform a heating process for 5 hours in an atmosphere of 680° C. A cross-section SEM image of the obtained piezoelectric body was obtained by the use of an SEM. The result is shown in FIG. 8.

After that, an upper electrode layer was produced in the same manner as in the method of producing the lower electrode layer.

Then, the Si substrate was subjected to a dry etching process by ICP from a surface opposite to a surface on which the diaphragm was provided to remove a central portion thereof, thereby forming a recessed portion. The temperature of the substrate was set to 20° C., $SF_6$ and $C_4F_8$ were used as gases, a dielectric constant of a high-frequency coil was set to 1800 W of RF power, and the pressure inside the device was set to 4.0 Pa. The nozzle plate made of Si having liquid discharge ports was bonded to the Si substrate having the above-mentioned recessed portions by Si—Si bonding. Assuming that the diaphragm of each piezoelectric element 10 has a length of 5000 μm and a width of 100 μm, the liquid discharge head was produced.

With respect to the obtained liquid discharge head, a displacement amount of the piezoelectric element at an applied voltage of 20 V and at 10 kHz, a discharge amount of an ink liquid (with a density of $1.0 \times 10^3$ kg/m$^3$, a viscosity of 2 cps, and a surface tension of $3.5 \times 10^{-2}$ N/m) of the liquid discharge head, and a discharge speed were measured. The measurement of the displacement amount was performed such that convergence of the liquid discharge head in a state where no ink is provided therein was measured with a laser Doppler displacement meter at the center of the recessed portion (at the center of a width of 70 μm and at the center of a length of 3 mm). The measurement of the discharge amount was performed by synchronizing a discharged liquid droplet with an input signal and observing each size of liquid droplets by CCD. The measurement of the discharge speed was also performed by synchronizing a liquid droplet with an input signal and observing the liquid droplets by CCD. The results are shown in Tables 1 and 2.

Further, a test for durability of the liquid discharge head was performed. There was no non-discharging nozzle even when liquid discharge was performed over $10^9$ times.

Comparative Example 1

In producing a piezoelectric body, the piezoelectric body was produced, so as to produce a liquid discharge head, in the same manner as in Example 1 except that crystals were grown at the substrate temperature of 600° C. at the time of sputtering and the piezoelectric body was produced without performing the heating process thereafter in the atmosphere.

Figure 9:
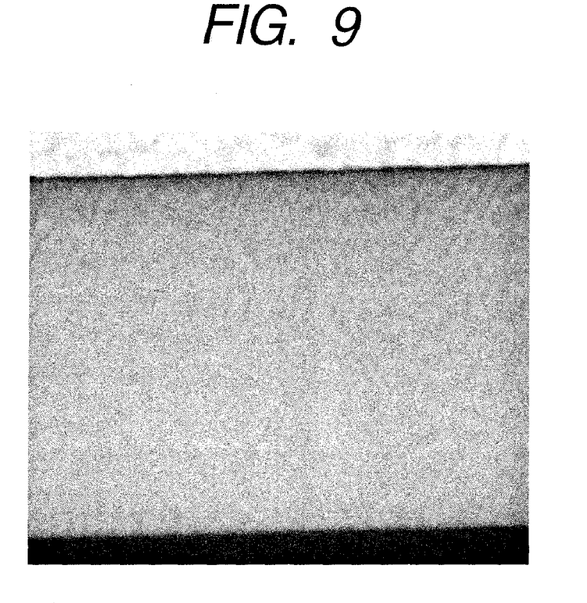
FIG. 9 is a diagram illustrating a cross-section SEM image of a piezoelectric body according to Comparative Example 1 of the present invention.
Figure 10:
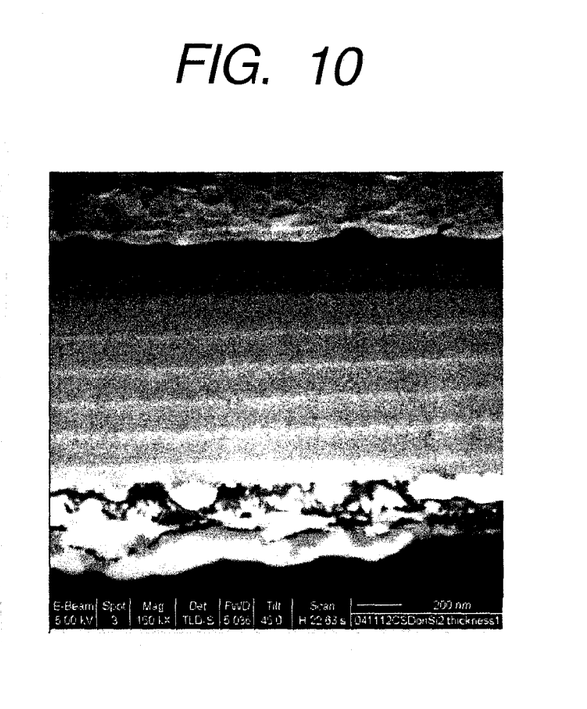
FIG. 10 is a diagram illustrating a cross-section SEM image of a piezoelectric body according to Comparative Example 2 of the present invention.

A cross-section SEM image of the obtained piezoelectric body was obtained in the same manner as in Example 1. The result is shown in FIG. 9. With respect to the liquid discharge head, a displacement amount of the piezoelectric element, a discharge amount of liquid droplets of the liquid discharge head, and a discharge time were measured in the same manner as in Example 1. The results are shown in Tables 1 and 2.

In addition, in the durability test, after the liquid discharge was performed $10^6$ to $10^7$ times, peeling was caused and a non-discharging nozzle was generated.

Comparative Example 2

In manufacturing a piezoelectric body, a chemical solution deposition (CSD) method (sol-gel method) was employed. Lead acetate having a composition corresponding to the composition similar to that of the target used in Example 1, lanthanum isopropoxide, zirconium butoxide, and titanium isopropoxide were heated and dissolved in methoxyethanol. The solution thus obtained was hydrolyzed with diluted hydrochloric acid, thereby obtaining a coating liquid (sol) for the piezoelectric body having 10 wt.% of $Pb1.1La0.01Zr0.52Ti0.48O_3$ (concentration in terms of oxide).

Then, the sol was coated on the substrate at 3000 rpm by using a spin coater, and was dried for 5 minutes at 400° C. to remove a solvent, thereby forming a precursor film. Every time the operation of coating and drying was repeated three times, temporal burning was performed for 15 minutes at 650° C. After the coating, drying, and temporal burning of seven layers, the entire substrate was last subjected to a heating process for 1 hour at 700° C. to be crystallized, thereby obtaining a 7-times coated film of various piezoelectric bodies. The liquid discharge head was produced in the same manner as in Example 1 except for the method of producing the piezoelectric body.

A cross-section SEM image of the obtained piezoelectric body was obtained in the same manner as in Example 1. The result is shown in Table 1. With respect to the liquid discharge head, a displacement amount of the piezoelectric element, a discharge amount of liquid droplets of the liquid discharge head, and a discharge time were measured in the same manner as in Example 1. The results are shown in Tables 1 and 2.

In addition, in the durability test, after the liquid discharge was performed $10^6$ to $10^7$ times, peeling was caused and a non-discharging nozzle was generated.

TABLE 1

|  | Example 1 | Comparative Example 1 | Comparative Example 2 |
| --- | --- | --- | --- |
| Displacement (nm) | 90 | 50 | 60 |

From the results, the displacement amount of the piezoelectric element according to Example 1 was 90 nm, the piezoelectric element being formed of the piezoelectric body subjected to a heating process in the atmosphere after the crystal growth by sputtering at 400° C. On the contrary, the displacement amount of the piezoelectric element of Comparative Example 1 was 50 nm, the piezoelectric element not being subjected to a heating process after the crystal growth by sputtering at 600° C. In addition, the displacement amount of the piezoelectric element formed of the piezoelectric body produced by the CSD method was 60 nm.

TABLE 2

|  | Example 1 | Comparative Example 1 | Comparative Example 2 |
| --- | --- | --- | --- |
| Discharge Amount (pl) | 14 | 12 | 12 |
| Discharge Speed (m/sec) | 8 | 6 | 5 |

From the results, it is apparent that, in the liquid discharge head according to the present invention, the liquid discharge amount is increased and the liquid discharge can be performed at a high speed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims benefit of Japanese Patent Application No. 2006-194703, filed Jul. 14, 2006, which is hereby incorporated by reference herein in its entirety.

What is claimed is:

1. A method of manufacturing a piezoelectric body of a film composed of an $ABO_3$ perovskite oxide crystal epitaxially grown on a substrate, comprising in this order:

forming a film containing an $AO_x$ crystal by using an oxide containing an A element and a B element on the substrate heated to a temperature which is equal to or higher than a temperature at which the $AO_x$ crystal is formed, and which is lower than a temperature at which the $ABO_3$ perovskite oxide crystal is formed; and changing the film containing the $AO_x$ crystal into a film composed of the $ABO_3$ perovskite oxide crystal by heating the substrate to a temperature which exceeds a temperature at which the $AO_x$ crystal can be present, and which is equal to or higher than a temperature at which the $ABO_3$ perovskite oxide crystal is formed.

2. A method of manufacturing a piezoelectric body according to claim 1, wherein the film composed of the $ABO_3$ perovskite oxide crystal comprises one of a single crystal film and a single orientation film.

3. A method of manufacturing a piezoelectric body according to claim 1, wherein the $ABO_3$ perovskite oxide comprises a Pb-based oxide.

4. A method of manufacturing a piezoelectric body according to claim 1, wherein the film composed of the $ABO_3$ perovskite oxide crystal has a thickness of 100 nm to 10 μm.

5. A method of manufacturing a piezoelectric body according to claim 1, wherein the step of forming the film is performed by a sputtering method.

6. A piezoelectric element, comprising:
a piezoelectric body including a film composed of an $ABO_3$ perovskite oxide crystal obtained by using the method of manufacturing a piezoelectric body according to claim 1; and
a pair of electrodes provided to the piezoelectric body.

7. A liquid discharge head, comprising:
the piezoelectric element according to claim 6;
a discharge port for discharging a liquid; and
a liquid chamber which is provided so as to correspond to the piezoelectric element and which communicates with the discharge port.

* * * * *